(12) United States Patent
Xie (10) Patent No.: US 11,783,787 B2
(45) Date of Patent: Oct. 10, 2023

(54) DRIVING DEVICE AND ELECTRONIC APPARATUS

(71) Applicant: Chipone Technology (Beijing) Co., LTD., Beijing (CN)

(72) Inventor: Zongzhe Xie, Beijing (CN)

(73) Assignee: Chipone Technology (Beijing) Co., LTD., Beijing (CN)

( * ) Notice: Subject to any disclaimer, the term of this patent is extended or adjusted under 35 U.S.C. 154(b) by 0 days.

(21) Appl. No.: 17/855,642

(22) Filed: Jun. 30, 2022

(65) Prior Publication Data

US 2022/0335906 A1 Oct. 20, 2022

Related U.S. Application Data

(63) Continuation of application No. PCT/CN2020/132753, filed on Nov. 30, 2020.

(30) Foreign Application Priority Data

Oct. 12, 2020 (CN) .......................... 202011086740.3

(51) Int. Cl.
*G09G 3/34* (2006.01)
*G09G 3/36* (2006.01)
(Continued)

(52) U.S. Cl.
CPC ......... *G09G 3/3406* (2013.01); *G09G 3/3208* (2013.01); *G09G 3/36* (2013.01);
(Continued)

(58) Field of Classification Search
CPC ...... G09G 3/3406; G09G 3/3208; G09G 3/36; G09G 2300/04; G09G 2320/0247; H02M 3/156; H03F 3/45076
See application file for complete search history.

(56) References Cited

U.S. PATENT DOCUMENTS

2006/0278242 A1 12/2006 McGlennen et al.
2008/0298105 A1* 12/2008 Kashima ................. H02M 1/32
363/126
(Continued)

FOREIGN PATENT DOCUMENTS

CN 103021336 4/2013
CN 103021336 A * 4/2013
(Continued)

OTHER PUBLICATIONS

PCT International Search Report in International Appln. No. PCT/CN2020/132753, dated Jul. 8, 2021, 7 pages (With English Translation).

*Primary Examiner* — Amare Mengistu
*Assistant Examiner* — Jennifer L Zubajlo
(74) *Attorney, Agent, or Firm* — Fish & Richardson P.C.

(57) ABSTRACT

The present disclosure relates to a driving device. The device includes a first voltage generation module, a voltage regulation module, a first switch module, a first capacitor module, a first transistor module, and a first light-emitting module. The first voltage generation module may be configured to generate a first voltage; the first switch module may be configured to output the first voltage to a first end of the first capacitor module over a first period; the voltage regulation module may be configured to determine a second voltage based on an amount of change in a voltage at the first end of the first capacitor module and to output the second voltage to the second end of the first capacitor module over a second period; and the first transistor module may be configured to drive the first light-emitting module to emit a light using voltage at the first end of the first capacitor.

20 Claims, 4 Drawing Sheets

(51) Int. Cl.
*H02M 3/156* (2006.01)
*H03F 3/45* (2006.01)
*G09G 3/3208* (2016.01)

(52) U.S. Cl.
CPC ........ *H02M 3/156* (2013.01); *H03F 3/45076* (2013.01); *G09G 2300/04* (2013.01); *G09G 2320/0247* (2013.01)

(56) References Cited

U.S. PATENT DOCUMENTS

| | | | |
|---|---|---|---|
| 2009/0207158 A1 | 8/2009 | Park et al. | |
| 2014/0002332 A1* | 1/2014 | Huang | G09G 3/3406 345/82 |
| 2015/0377856 A1* | 12/2015 | Dunbar | H03F 3/45076 204/452 |
| 2016/0181942 A1* | 6/2016 | Sugawara | H02M 3/156 363/126 |
| 2022/0271664 A1* | 8/2022 | Jaladanki | H02M 3/156 |
| 2022/0328004 A1* | 10/2022 | Xie | G09G 3/32 |

FOREIGN PATENT DOCUMENTS

| | | |
|---|---|---|
| CN | 108809088 | 11/2018 |
| CN | 110827764 | 2/2020 |
| CN | 110868069 | 3/2020 |
| CN | 111596716 | 8/2020 |
| JP | 2000-163015 | 6/2000 |
| JP | 2003-150107 | 5/2003 |
| JP | 2005-331933 | 12/2005 |
| JP | 2006-525539 | 11/2006 |
| JP | 2007-148128 | 6/2007 |
| JP | 2009-036933 | 2/2009 |
| JP | 2009-075320 | 4/2009 |
| JP | 2009-199057 | 9/2009 |
| JP | 2009-251590 | 10/2009 |
| JP | 2012-118381 | 6/2012 |
| JP | 2016-062101 | 4/2016 |
| JP | 2016-090922 | 5/2016 |
| JP | 2017-223855 | 12/2017 |
| JP | 2018-072780 | 5/2018 |
| WO | WO 2011058647 | 5/2011 |

* cited by examiner

DRIVING DEVICE AND ELECTRONIC APPARATUS

CROSS-REFERENCE TO RELATED APPLICATIONS

This present application is a continuation of and claims priority under 35 U.S.C. § 120 to PCT Application No. PCT/CN2020/132753, filed on Nov. 30, 2020, which claims priority to Chinese Application No. 202011086740.3, filed on Oct. 12, 2020, and entitled "DRIVING APPARATUS AND ELECTRONIC DEVICE." All the above referenced priority documents are incorporated herein by reference in their entireties.

TECHNICAL FIELD

The present disclosure relates to the display technical field, in particular to a driving device and an electronic apparatus.

BACKGROUND

With the development of science and technology and the improvement of people's living standards, various types of electronic apparatuses with a display function are increasingly popular. However, a display panel of the current electronic apparatus has the problem of flickering caused by leakage of a device of the display panel itself, which not only affects user experience but also shortens the life of the display panel.

SUMMARY

In view of the above, the present disclosure provides a driving device, comprising: a first voltage generation module, a voltage regulation module, a first switch module, a first capacitor module, a first transistor module, and a first light-emitting module, wherein
  the first voltage generation module is configured to generate a first voltage;
  the first switch module, electrically connected to the first voltage generation module and the first capacitor module, is configured to output the first voltage to a first end of the first capacitor module in over first period;
  the voltage regulation module, electrically connected to a second end of the first capacitor module, is configured to determine a second voltage based on an amount of change in a voltage at the first end of the first capacitor module and output the second voltage to the second end of the first capacitor module over a second period to set the voltage at the first end of the first capacitor module; and
  the first transistor module, electrically connected to the first end of the first capacitor module and to the first light-emitting module, is configured to drive the first light-emitting module to emit a light using the voltage at the first end of the first capacitor module.

In a possible implementation, the first voltage generation module comprises:
  a first voltage generating unit configured to generate the first voltage based on luminance information and a predetermined luminance-voltage relationship, the predetermined luminance-voltage relationship including a correlation between the luminance information and the voltage.

In a possible implementation, the voltage regulation module comprises:
  a current sensing unit configured to determine a sensed current based on the amount of change in the voltage at the first end of the first capacitor module; and
  a resistor unit, the first end of which is electrically connected to the current sensing unit and the second end of the first capacitor module and the second end of which is grounded, configured to determine the second voltage based on the sensed current and a resistance of the resistor unit.

In a possible implementation, the current sensing unit includes a second voltage generation module, a second switch module, a second capacitor module, a second transistor module, a second light-emitting module, an operational amplifier module, and a third transistor module, wherein
  the second voltage generation module is configured to generate the first voltage;
  the second switch module, electrically connected to the second voltage generation module and the second capacitor module, is configured to output the first voltage to a first end of the second capacitor module over a third period;
  the second transistor module, electrically connected to the first end of the second capacitor module and the second light-emitting module, is configured to drive the second light-emitting module to emit a light using voltage at the first end of the second capacitor module;
  the operational amplifier module, electrically connected to the second voltage generation module, the first end of the second capacitor module, and the third transistor module, is configured to obtain a sensed voltage based on the first voltage and the voltage at the first end of the second capacitor module, the sensed voltage being the amount of change in the voltage at the first end of the first capacitor module; and
  the third transistor module, electrically connected to the operational amplifier module, the first end of the resistor unit, and the second end of the first capacitor module, is configured to generate the sensed current based on the sensed voltage.

In a possible implementation, the sensed voltage includes a first sensed voltage and a second sensed voltage, the sensed current includes a first sensed current and a second sensed current, the operational amplifier module includes a first operational amplifier and a second operational amplifier, the third transistor module includes a first sensing transistor and a second sensing transistor, and the device further includes a third switch module which contains a first sensing switch and a second sensing switch, wherein
  a non-inverting input of the first operational amplifier is configured to input the first voltage, an inverting input of the first operational amplifier is configured to input a first end voltage of the second capacitor module, an output of the first operational amplifier is electrically connected to a gate of the first sensing transistor and outputs the first sensed voltage; a drain of the first sensing transistor is configured to receive a supply voltage, a source of the first sense source of the first sensing transistor electrically connected to the first end of the first sensing switch is configured to output the first sensed current, and the second end of the first sensing switch is electrically connected to the first end of the resistor unit and the second end of the first capacitor module, and a non-inverting input of the second operational amplifier is configured to input the first voltage, an inverting input of the second operational amplifier is configured to input voltage at the first end of the second capacitor module, the output of the second operational amplifier is electrically connected to a gate of the second sensing transistor and outputs the second sensed voltage; a drain of the second sensing transistor is configured to receive a supply voltage, a source of the second sensing transistor electrically connected to the first end of the second sensing switch is configured to output the second sensed current, and the second end of the second sensing switch is electrically connected to the first end of the resistor unit and the second end of the first capacitor module.

In a possible implementation, the sensed voltage includes a first sensed voltage and a second sensed voltage, the sensed current includes a first sensed current and a second sensed current, the operational amplifier module includes a first operational amplifier, and the third transistor module includes a first sensing transistor and a second sensing transistor, wherein a non-inverting input of the first operational amplifier is configured to input the first voltage, an inverting input of the first operational amplifier is configured to input the voltage at the first end of the second capacitor module, an output of the first operational amplifier is electrically connected to the gate of the first sensing transistor and outputs the first sensed voltage; a drain of the first sensing transistor is configured to receive a supply voltage, a source of the first sensing transistor electrically connected to the first end of the resistor unit and the second end of the first capacitor module is configured to output the first sensed current; and an output of the first operational amplifier is electrically connected to the gate of the second sensing transistor and outputs the second sensed voltage; a drain of the second sensing transistor is configured to receive a supply voltage, and a source of the second sensing transistor is electrically connected to the first end of the resistor unit and the second end of the first capacitor module is configured to output the second sensed current.

In a possible implementation, the first sensing switch is configured to turn on when the first sensed current is a positive current and the second sensing switch is configured to be turn on when the second sensed current is a negative current.

In a possible implementation, the first switch module comprises a first switch, a first end of which is configured to receive the first voltage and a second end of the first switch is electrically connected to a first end of the first capacitor module.

In a possible implementation, the first switch module is further configured to turn the first switch on over the first period to output the first voltage to a first end of the first capacitor module and turn the first switch off over the second period.

In a possible implementation, the second voltage generation module is a duplicate of the first voltage generation module, the second switch module is a duplicate of the first switch module, the second capacitor module is a duplicate of the first capacitor module, the second transistor module is a duplicate of the first transistor module, and the second light-emitting module is a duplicate of the first light-emitting module.

In a possible implementation, the first capacitor module comprises:

a first capacitor with a first end serving as a first end of the first capacitor module electrically connected to the first switch module and the first transistor module, and a second end serving as a second end of the first capacitor module electrically connected to the voltage regulation module.

In a possible implementation, the first transistor module comprises a plurality of first transistor modules, a plurality of first capacitor modules, and a plurality of first light-emitting modules, a first switch module may include a plurality of first switches, and a first voltage generation module may generate a plurality of first voltages, wherein the voltage generation module is further configured to output a plurality of first voltages, each first voltage corresponding to a respective transistor module; and the voltage regulation module is configured to output the generated second voltage to the second end of each first capacitor module to compensate for voltage at the first end of each first capacitor module.

In a possible implementation, the light-emitting module comprises any one or more of LCD, LED, MiniLED, MicroLED, and OLED.

According to an aspect of the present disclosure, there is provided an electronic apparatus comprising the driving device.

In a possible implementation, the electronic apparatus comprises a display, a smartphone or a portable device.

With the above device, the embodiments of the present disclosure may generate a first voltage and output the first voltage to the first end of the first capacitor module in the first period, and determine a second voltage based on the amount of change in the first end voltage of the first capacitor module to output to the second end of the first capacitor module, and set the voltage at the first end of the first capacitor module so as to compensate for and adjust the leakage in the device, thereby solving the flickering of the first light-emitting module.

Other features and aspects of the present disclosure will become clear based on the detailed description of the exemplary embodiments with reference to the accompanying drawings below.

BRIEF DESCRIPTION OF THE DRAWINGS

The accompanying drawings, which are included in and form part of the description, together with the description, illustrate exemplary embodiments, features and aspects of the present disclosure and serve to explain the principles of the present disclosure.

DETAILED DESCRIPTION

Various exemplary embodiments, features and aspects of the present disclosure are described in detail below with reference to the accompanying drawings. Identical reference signs in the drawings indicate components with identical or similar functions. Although various aspects of the embodiments are illustrated in the drawings, it is not necessary to draw the drawings to scale unless otherwise indicated.

The term "exemplary" used herein means "used as an example, an embodiment, or an illustration". Any embodiment illustrated herein as "exemplary" is not necessary to be construed as superior to or better than other embodiments.

In addition, numerous details are given in the specific embodiments below to better illustrate the present disclosure. It should be understood by those skilled in the art that the present disclosure can be implemented equally well without certain specific details. In some examples, methods, means, components and circuits known to those skilled in the art are not described in detail in order to highlight the main idea of the present disclosure.

Figure 1:
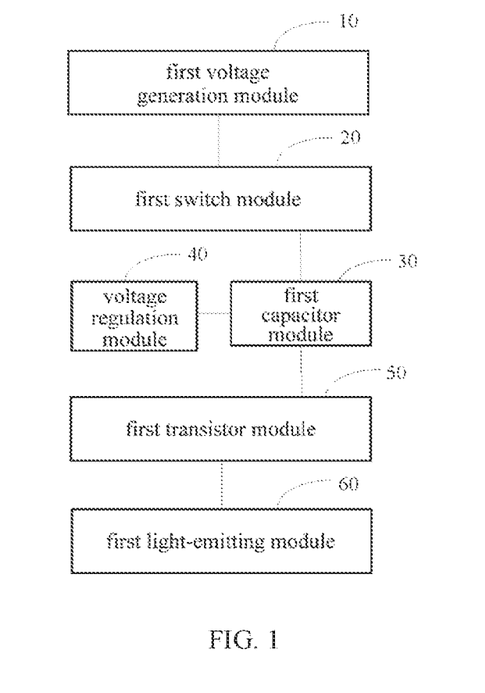
FIG. 1 is a block diagram of a driving device according to an embodiment of the present disclosure.

Referring to FIG. 1, FIG. 1 is a block diagram of a driving device according to an embodiment of the present disclosure.

As shown in FIG. 1, the device comprises a first voltage generation module 10, a first switch module 20, a first capacitor module 30, a voltage regulation module 40, a first transistor module 50, and a first light-emitting module 60, wherein the first voltage generating module 10 is configured to generate a first voltage;
the first switch module 20, electrically connected to the first voltage generation module 10 and the first capacitor module 30, is configured to output the first voltage to the first end of the first capacitor module 30 in the first period;
the voltage regulation module 40, electrically connected to the second end of the first capacitor module 30, is configured to determine a second voltage based on the amount of change in the voltage at the first end of the first capacitor module 30 and output the second voltage to the second end of the first capacitor module 30 in the second period to set the voltage at the first end of the first capacitor module 30;
the first transistor module 50, electrically connected to the first end of the first capacitor module 30 and the first light-emitting module 60, is configured to drive the first light-emitting module 60 to emit a light using the voltage at the first end of the first capacitor module 30.

With the above device, the embodiments of the present disclosure may generate a first voltage and output the first voltage to the first end of the first capacitor module in the first period, determine a second voltage based on the amount of change in the first end voltage of the first capacitor module to output to the second end of the first capacitor module, and set the voltage at the first end of the first capacitor module so as to compensate for and adjust the leakage in the device, thereby solving the flickering of the first light-emitting module.

The device of the embodiments of the present disclosure can be various electronic apparatuses with a display function, such as a user equipment (UE), a mobile station (MS), or a mobile end (MT). This device provides voice and/or data connectivity to a user, for example, a handheld device and an in-vehicle device with wireless connectivity. Currently, some examples of terminals are mobile phone, tablet PC, laptop, PDA, mobile internet device (MID), wearable device, virtual reality (VR) device, augmented reality (AR) devices, wireless terminals in industrial control, wireless terminals in self-driving, wireless terminals in remote medical surgery, wireless terminals in smart grid, wireless terminals in transportation safety, and wireless terminals in a smart city, wireless terminal in smart city, wireless terminals in smart home, wireless terminals in vehicular network, etc.

In a possible implementation, the light-emitting module may comprise any one or more of an LCD (Liquid Crystal Display), an LED (Light-emitting Diode), a Mini LED (Mini Light-emitting Diode), a Micro LED (Micro Light-emitting Diode, Micro Light-emitting Diode), and an OLED (Organic Light-Emitting Diode).

It should be noted that each individual module in the device of the embodiments of the present disclosure can be implemented by a hardware circuit. The following is a description of exemplary possible implementations of the individual module in the driving device.

Figure 2:
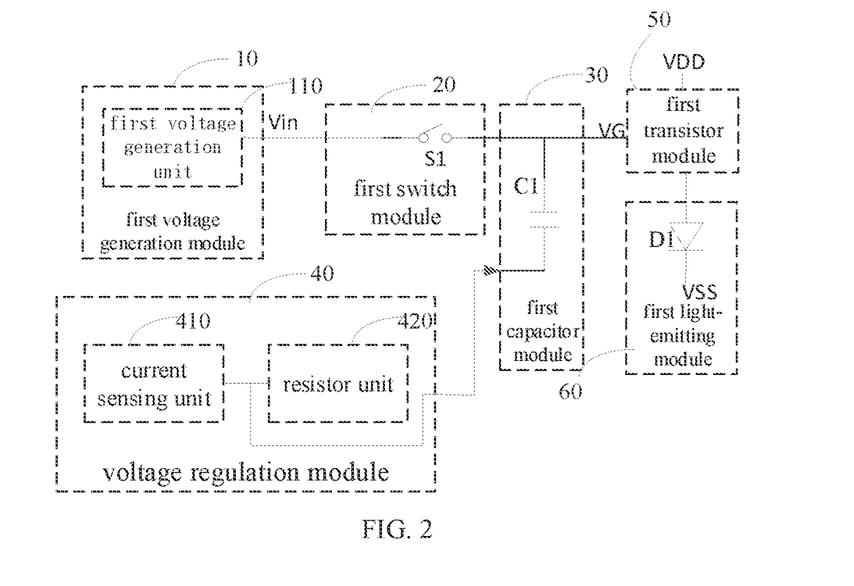
FIG. 2 is a schematic graph of a driving device according to an embodiment of the present disclosure.

Referring to FIG. 2, FIG. 2 is a schematic graph of a driving device according to an embodiment of the present disclosure.

In a possible implementation, as shown in FIG. 2, the first voltage generation module 10 may include
a first voltage generation unit 110 configured to generate the first voltage Vin based on the luminance information and a preset luminance-voltage relationship, wherein the preset luminance-voltage relationship comprises a correlation between the luminance information and the voltage.

In an example, the preset luminance relationship may be set in advance. For example, the association between luminance and voltage may be set based on a type of the display transistor included in the first light-emitting module. Different preset luminance-voltage relationships may be set for different first light-emitting modules. Of course, the preset luminance relationship may take form of a table or other forms, which is not limited in the embodiments of the present disclosure.

The specific preset luminance relationship and the type of the first light-emitting module are not limited in the embodiments of the present disclosure and can be determined by those skilled in the art as needed.

In an example, the first voltage generation unit may include a plurality of resistors in series connection, thereby determining a different first voltage by dividing the supply voltage with the plurality of resistors.

Of course, the above description of the first voltage generation unit is illustrative. The present disclosure does not limit the specific implementation of the first voltage generation unit; those skilled in the art may choose the implementation by a voltage generation device (e.g., AC/DC conversion device or DC/DC conversion device) in the related art as per the needs.

In an example, the first voltage generation module may include a storage unit (not shown) for storing a preset luminance relationship or other data generated by the individual module of the driving device.

The memory unit can be implemented by any type of volatile or non-volatile storage device or a combination thereof, such as static random access memory (SRAM), electrically erasable programmable read-only memory (EEPROM), erasable programmable read-only memory (EPROM), programmable read-only memory (PROM), read-only memory (ROM), magnetic memory, flash memory, disk or CD-ROM.

In a possible implementation, as shown in FIG. 2, the first switch module 20 may comprise a first switch S1, a first end of the first switch S1 is configured to receive the first voltage Vin, and a second end of the first switch S1 is electrically connected to the first end of the first capacitor module 30.

In a possible embodiment, the first switch module is further configured to
close the first switch in the first period to output the first voltage to a first end of the first capacitor module; and
open the first switch in the second period.

In an example, the first period may be set as needed, and the second period may be a period after the completion of timing of the first period.

It should be noted that the amount of leakage of the capacitor module and the transistor module in the driving device is directly correlated (proportional) to the duration of the first period. Exemplarily, the amount of change of the voltage at the first end of the first capacitor module $\Delta V=$ (IOFF*T)/CS, where IOFF denotes magnitude of the current of leakage, T denotes duration of the first period, and CS denotes the capacitance of the first capacitor module. As can be seen, the amount of change is correlated with the duration.

When different durations are set for the first period, the amount of leakage has different values and the second voltage generated by the voltage regulation module also has different values. The second voltage is correlated with the size of leakage and the second voltage is also correlated with the time duration of the first period.

In a possible implementation, as shown in FIG. 2, the first capacitor module 30 may comprise:
a first capacitor C1 with a first end serving as a first end of the first capacitor module 30 electrically connected to the first switch module 20 and the first transistor module 50, and a second end serving as a second end of the first capacitor module 30 electrically connected to the voltage regulation module 40.

In a possible implementation, the first transistor module 50 may comprise at least one transistor. The transistor may be an NMOS transistor, a PMOS transistor, or the like.

The first transistor module 50 may serve as a driver stage for the first light-emitting module 60 to drive the first light-emitting module to emit a light.

In a possible implementation, leakage may occur in the first capacitor module and the first transistor module in the driving device. For example, assuming that the first transistor module comprises a PMOS transistor, the leakage of the PMOS transistor will cause the voltage at the first end of the first capacitor module to increase; assuming that the first transistor module comprises a NMOS transistor, the leakage of the NMOS transistor will cause the voltage at the first end of the first capacitor module to decrease; the leakage of the capacitor in the first capacitor module will cause the voltage of the first capacitor module to decrease. On the one hand, if the leakage causes the voltage at the first end of the first capacitor module to decrease, a loss of the first voltage generated by the first voltage generation unit will be resulted; in that case, if the light-emitting module is still activated by the first voltage to drive the transistor module, the luminous brightness will be insufficient, causing abnormal display of the emitting module; on the other hand, if the leakage causes the voltage at the first end of the first capacitor module to increase, the light-emitting module will emit a light at a brightness higher than expected, causing flickering of the light-emitting module, or even more seriously, leading to damage of the light-emitting module, which affects the user experience.

In a possible implementation, as shown in FIG. 2, the voltage regulation module 40 may include
a current sensing unit 410 configured to determine the sensed current based on the amount of change in the voltage at the first end of the first capacitor module 30;
a resistor unit 420, with the first end of which electrically connected to the current sensing unit 410 and a second end of the first capacitor module 30 and the second end of which grounded, is configured to determine the second voltage based on the sensed current and the resistance of the resistor unit 420.

The embodiments of the present disclosure may determine the sensed current based on the amount of change in the voltage at the first end of the first capacitor module using the current sensing unit and determine the second voltage based on the sensed current and the resistance of the resistor unit using the resistor unit to compensate for the leakage.

Figure 3:
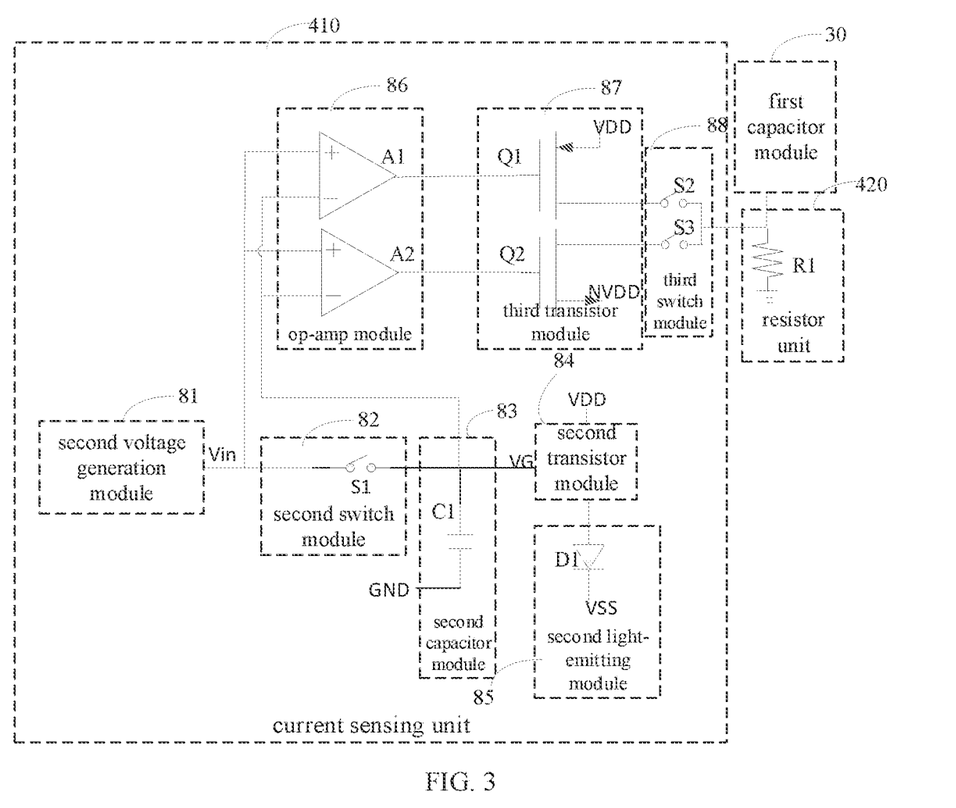
FIG. 3 is a schematic graph of a voltage regulation module according to an embodiment of the present disclosure.

Referring to FIG. 3, FIG. 3 is a schematic graph of a voltage regulation module according to an embodiment of the present disclosure.

In a possible implementation, as shown in FIG. 3, the current sensing unit 410 may include a second voltage generation module 81, a second switching module 82, a second capacitor module 83, a second transistor module 84, a second light-emitting module 85, an operational amplifier module 86, and a third transistor module 87, wherein
the second voltage generation module 81 is configured to generate a first voltage Vin;
the second switching module 82, electrically connected to the second voltage generation module 81 and the second capacitor module 83, is configured to output the first voltage to the first end of the second capacitor module 83 in the third period.
the second transistor module 84, electrically connected to the first end of the second capacitor module 83 and the second light-emitting module 85, is configured to drive the second light-emitting module 85 to emit a light using the voltage at the first end of the second capacitor module 83;
the operational amplifier module 86, electrically connected to the second voltage generation module 81, the first end of the second capacitor module 83 and the third transistor module 87, is configured to obtain a sensed voltage based on the first voltage Vin and the voltage at the first end of the second capacitor module 83, the sensed voltage being the amount of change in the voltage at the first end of the first capacitor module 30;
the third transistor module 87, electrically connected to the operational amplifier module 86, the first end of the resistor unit 420 and the second end of the first capacitor module 30, is configured to generate the sensed current based on the sensed voltage.

In a possible implementation, the second voltage generation module is a duplicate of the first voltage generation module, the second switch module is a duplicate of the first switch module, the second capacitor module is a duplicate of the first capacitor module, the second transistor module is a duplicate of the first transistor module, and the second light-emitting module is a duplicate of the first light-emitting module.

The embodiments of the present disclosure obtain a second voltage generation module, a second switch module, a second capacitor module, a second transistor module, and a second light-emitting module by duplicating the first voltage generation module, the first switch module, the first capacitor module, the first transistor module, and the first light-emitting module in the driving device to obtain the amount of change in the voltage at the first end of the first capacitor module, thereby sensing the amount of leakage and obtaining a corresponding second voltage to compensate for the leakage, which makes it possible to effectively solve the problem of flickering of the light-emitting module.

The "duplicate" of each module in the embodiments of the present disclosure may refer to a mass production of each individual module through industrial manufacturing, for example, producing the same or similar modules by setting the same parameters, using the same raw materials and through the same manufacturing process performed by the same manufacturing equipment.

Based on the above configuration, the embodiments of the present disclosure may generate the first voltage using the second voltage generation module in the voltage regulation module and output the first voltage to the first end of the second capacitor module through the second switch module in the third period (with the same duration as the first period); the second switch module is capable of breaking the electrical connection between the second voltage generation module and the second capacitor module at the end of the timing of the third period. At that time, the leakage of the second capacitor module and/or the third transistor module affects the voltage at the first end of the second capacitor module; the operational amplifier module obtains the voltage at the first end of the second capacitor module and the first voltage so as to obtain the amount of change in the voltage at the first end of the second capacitor module, which amount of change is equivalent to the amount of change in the voltage at the first end of the first capacitor module.

In a possible implementation, the sensed voltage may comprise a first sensed voltage and a second sensed voltage, and the sensed current may comprise a first sensed current and a second sensed current.

In a possible implementation, as shown in FIG. 3, the operational amplifier module 86 may comprise a first operational amplifier A1 and a second operational amplifier A2, the third transistor module 87 may comprise a first sensing transistor Q1 and a second sensing transistor Q2, the device may further comprise a third switch module 88 which may comprise a first sensing switch S2 and a second sensing switch S3, wherein the non-inverting input of the first operational amplifier A1 is configured to input the first voltage Vin, the inverting input of the first operational amplifier A1 is configured to input the first end voltage of the second capacitor module 83, the output of the first operational amplifier A1 is electrically connected to the gate of the first sensing transistor Q1 and outputs the first sensed voltage; the drain of the first sensing transistor Q1 is configured to receive the supply voltage VDD, the source of the first sensing transistor Q1 electrically connected to the first end of the first sensing switch S2 is configured to output the first sensed current, and the second end of the first sensing switch S2 is electrically connected to the first end of the resistor unit 420 (e.g., the first end of the resistor R1) (exemplarily the resistor unit 420 comprises the resistor R1) and the second end of the first capacitor module 30, and the non-inverting input of the second operational amplifier A2 is configured to input the first voltage Vin, the inverting input of the second operational amplifier A2 is configured to input the first end voltage of the second capacitor module 83, the output of the second operational amplifier A2 is electrically connected to the gate of the second sensing transistor Q2 and outputs the second sensed voltage; the drain of the second sensing transistor Q2 is configured to receive the supply voltage NVDD, the source of the second sensing transistor Q2 electrically connected to the first end of the second sensing switch S3 is configured to output the second sensed current, the second end of the second sense switch S3 is electrically connected to the first end of the resistor unit 420 (e.g., the first end of the resistor R1) (exemplarily the resistor unit 420 comprises the resistor R1) and the second end of the capacitance module 30.

In an example, the first sensing transistor Q1 may be a PMOS transistor.

In an example, the second sensing transistor Q2 may be an NMOS transistor.

In a possible implementation, the first sensing switch is configured to close when the first sensed current is a positive current and the second sensing switch is configured to close when the second sensed current is a negative current.

In an example, when the type of the transistor in the first transistor module is the PMOS transistor, the first transistor module leaks electricity to the first capacitor module, in which case, the voltage at the first end of the first capacitor module increases. Assuming that the first voltage is 5V and is kept for 1 second, the amount of change in the voltage at the first end of the first capacitor module $\Delta V=0.5V$, and the voltage at the first end of the first capacitor module is 5.5V; the second sensing transistor Q2 may obtain a sensed current of $-5$ μA that is kept for 1 second. Since the second sensed current is negative, the second sensing switch S3 is closed at this time and outputs the second sensed current to the second end of the resistor unit; assuming that the resistance of the resistor unit is 0.1 MΩ, the voltage regulation module obtains a second voltage of $-0.5V$ and outputs the second voltage to the second end of the first capacitor module, so that the voltage at the first end of the first capacitor module is reduced to 5V, thereby compensating for the leakage and solving the problem of flickering.

In an example, when the type of transistor in the first transistor module is the NMOS transistor, the first capacitor module leaks electricity to the first transistor module, and the first capacitor module itself also has a leakage, in which case the voltage at the first end of the first capacitor module decreases. Assuming that the first voltage is 5V and is kept for 1 second, the amount of change in the voltage at the first end of the first capacitor module $\Delta V=-0.5V$ and the voltage at the first end of the first capacitor module is 4.5V; the first sensing transistor Q1 may obtain a sensed current of 5 μA that is kept for 1 second. Since the first sensed current is positive, the first sensing switch S1 is closed at this time and outputs the first sensed current to the second end of the resistor unit; assuming that the resistance of the resistor unit is 0.1 MΩ, the second voltage obtained by the voltage regulation module is 0.5V, outputting the second voltage to the second end of the first capacitor module will increase the voltage at the first end of the first capacitor module to 5V, thereby compensating for the leakage to make improvement with regard to the flickering.

The above describes outputting the sensed current to the first end of the resistor unit by the third switch module. However, the present disclosure is not limited thereto. As the first sensing transistor and the second sensing transistor are of different types, they are not closed at the same time. In this case, the third switch module may be removed, which will be described exemplarily below.

Figure 4:
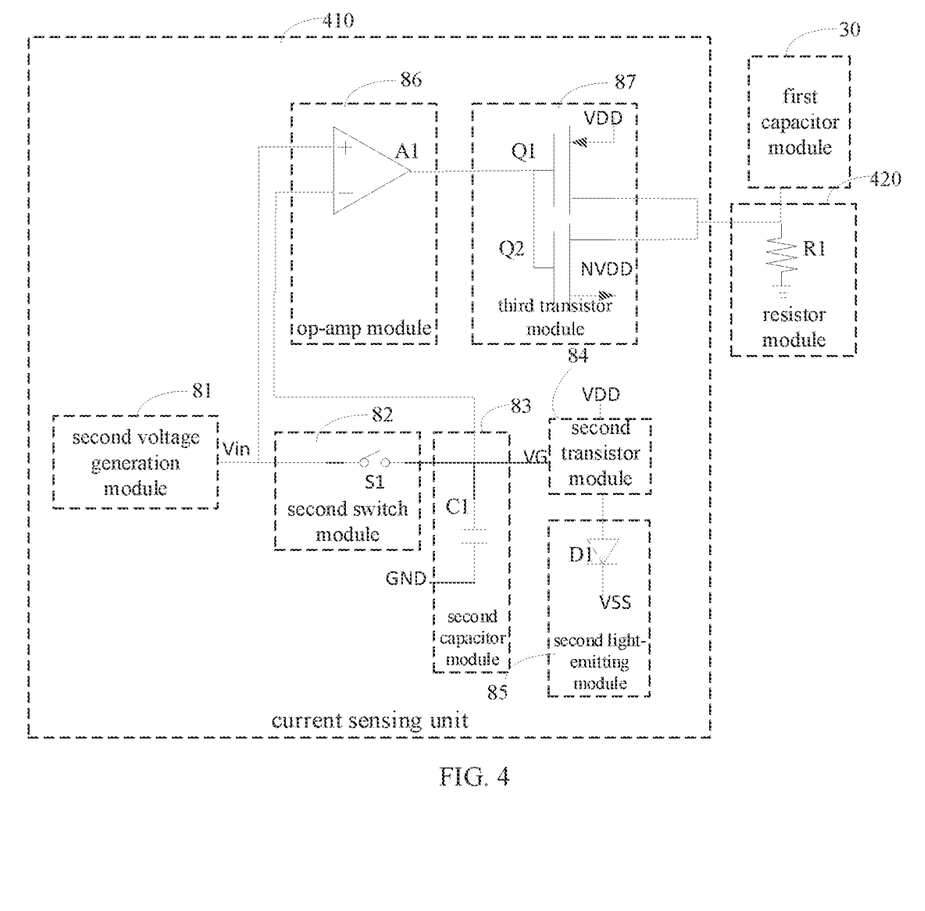
FIG. 4 is a schematic graph of a driving device according to an embodiment of the present disclosure.

Referring to FIG. 4, FIG. 4 is a schematic graph of a driving device according to an embodiment of the present disclosure.

In a possible implementation, as shown in FIG. 4, the operational amplifier module may include only the first operational amplifier A1, and does not include the second operational amplifier A2 shown in FIG. 3. The present disclosure is capable of outputting the sensed voltage to two sensing transistors by only one operational amplifier to obtain the sensed current.

In an example, the non-inverting input of the first operational amplifier A1 is configured to input the first voltage Vin, the inverting input of the first operational amplifier A1 is configured to input the first end voltage of the second capacitor module, the output of the first operational amplifier A1 is electrically connected to the gate of the first sensing transistor Q1 and outputs the first sensed voltage; the drain of the first sensing transistor Q1 is configured to receive the supply voltage VDD, the source of the first sensing transistor Q1, electrically connected to the first end of the resistor unit 420 and the second end of the first capacitor module 30, is configured to output the first sensed current.

In an example, if the voltage at the first end of the first capacitor module decreases due to leakage, the first operational amplifier A1 will sense a positive amount of change in the voltage. In that case, the first sensing transistor is closed while the second sensing transistor is open, and the first sensing transistor outputs a positive first sensed current to the first end of the resistor unit 420.

In an example, the output of the first operational amplifier A1 is electrically connected to the gate of the second sensing transistor Q2 and outputs the second sensed voltage; the drain of the second sensing transistor Q2 is configured to receive the supply voltage NVDD, and the source of the second sensing transistor, electrically connected to the first end of the resistor unit and the second end of the first capacitor module, is configured to output the second sensed current.

In an example, if the voltage at the first end of the first capacitor module increases due to leakage, the first operational amplifier A1 will sense a negative amount of change in the voltage. In that case, the second sensing transistor is closed while the first sensing transistor is open, and the second sensing transistor outputs a negative second sensed current to the first end of the resistor unit 420.

Figure 5:
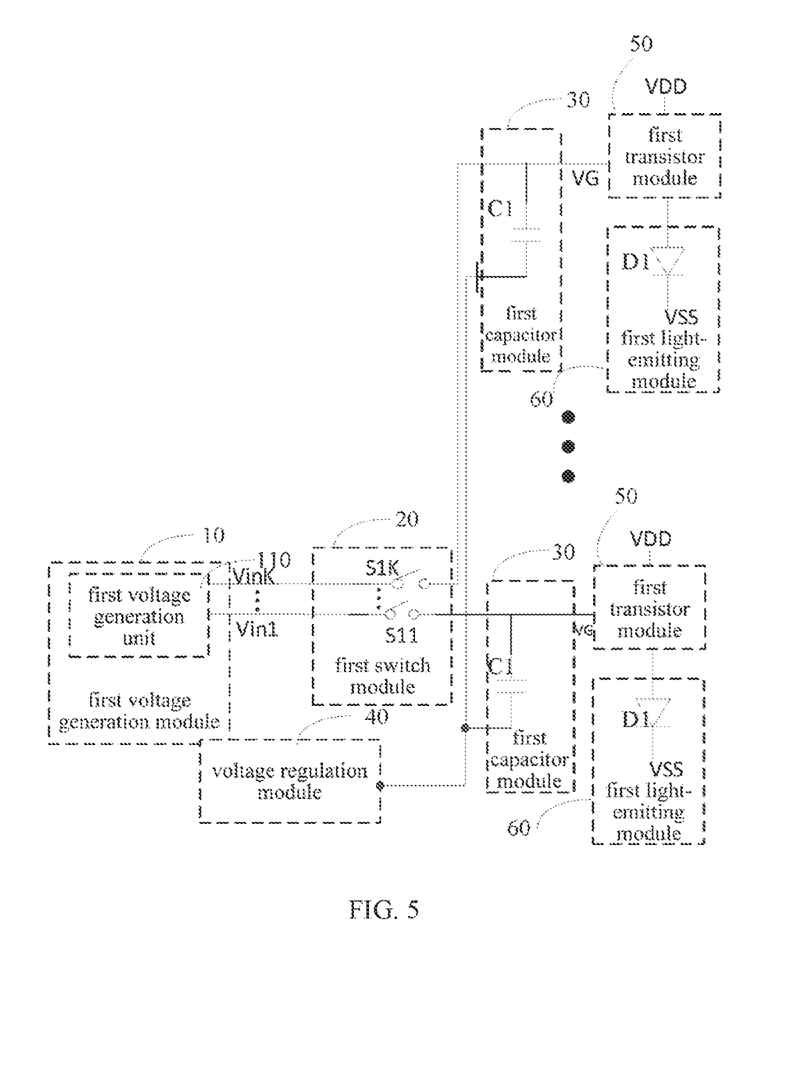
FIG. 5 is a schematic graph of a driving device according to an embodiment of the present disclosure.

Referring to FIG. 5, FIG. 5 is a schematic graph of a driving device according to an embodiment of the present disclosure.

In a possible embodiment, as shown in FIG. 5, the device may include a plurality of first transistor modules 50, a plurality of first capacitor modules 30, a plurality of first light-emitting modules 60, a first switch module 20 including a plurality of first switches (S11 to S1K, K being an integer greater than 1), and a first voltage generation module 10 capable of generating a plurality of first voltages (Vin1 to VinkK), wherein the voltage generation module is further configured to output a plurality of first voltages, each first voltage corresponding to a respective transistor module;

the voltage regulation module 40 may output the generated second voltages to the second end of each first capacitor module 30 to compensate for the voltage at the first end of each first capacitor module 30.

The connection between the voltage generation module, the switching module, the capacitor module and other modules in the above device may refer to the preceding description and will not be repeatedly described herein.

Based on the foregoing configuration, the embodiments of the present disclosure broadens the applicable range of the driving device, perform adaptive voltage compensation for a plurality of transistors on the display panel, and improve the flicker problem of each light-emitting module to improve the display effect of the whole display panel.

The above has described various embodiments of the present disclosure, the above description is exemplary and not exhaustive, and is not limited to the disclosed embodiments. Without departing from the scope and spirit of the illustrated embodiments, many modifications and changes will be apparent to those of ordinary skill in the art. The terminology used herein has been selected to best explain the principles, practical applications, or improvements to the technology in the marketplace of each embodiment, or to enable others of ordinary skill in the art to understand the various embodiments disclosed herein.

What is claimed is:

1. A driving device, comprising:
a first voltage generator, a voltage regulator, a first switch, a first capacitor, a first transistor, and a first light-emitting component, wherein:
the first voltage generator is configured to generate a first voltage;
the first switch, electrically connected to the first voltage generator and the first capacitor, is configured to output the first voltage to a first end of the first capacitor over a first period;
the voltage regulator, electrically connected to a second end of the first capacitor, is configured to:
determine a second voltage based on an amount of change in a voltage at the first end of the first capacitor, and
output the second voltage to the second end of the first capacitor over a second period to set the voltage at the first end of the first capacitor; and
the first transistor, electrically connected to the first end of the first capacitor and to the first light-emitting component, is configured to drive the first light-emitting component to emit light using the voltage at the first end of the first capacitor.

2. The device according to claim 1, wherein the first voltage generator comprises:
a first voltage generator configured to generate the first voltage based on luminance information and a predetermined luminance-voltage relationship, the predetermined luminance-voltage relationship including a correlation between the luminance information and a voltage.

3. The device according to claim 1, wherein the voltage regulator comprises:
a current sensor configured to determine a sensed current based on the amount of change in the voltage at the first end of the first capacitor; and
a resistor with a first end electrically connected to the current sensor and the second end of the first capacitor and a second end grounded, wherein the resistor is configured to determine the second voltage based on the sensed current and a resistance of the resistor.

4. The device according to claim 3, wherein the current sensor includes a second voltage generator, a second switch, a second capacitor, a second transistor, a second light-emitting component, an operational amplifier, and a third transistor, wherein:
the second voltage generator is configured to generate the first voltage;
the second switch, electrically connected to the second voltage generator and the second capacitor, is configured to output the first voltage to a first end of the second capacitor over a third period;

the second transistor, electrically connected to the first end of the second capacitor and the second light-emitting component, is configured to drive the second light-emitting component to emit light with a voltage at the first end of the second capacitor;

the operational amplifier, electrically connected to the second voltage generator, the first end of the second capacitor, and the third transistor, is configured to obtain a sensed voltage based on the first voltage and the voltage at the first end of the second capacitor, the sensed voltage being the amount of change in the voltage at the first end of the first capacitor; and the third transistor, electrically connected to the operational amplifier, a first end of the resistor, and the second end of the first capacitor, is configured to generate the sensed current based on the sensed voltage.

5. The device according to claim 4, wherein the sensed voltage includes a first sensed voltage and a second sensed voltage, the sensed current includes a first sensed current and a second sensed current, the operational amplifier includes a first operational amplifier and a second operational amplifier, the third transistor includes a first sensing transistor and a second sensing transistor, and the device further includes a third switch which contains a first sensing switch and a second sensing switch, wherein:

a non-inverting input of the first operational amplifier is configured to input the first voltage, an inverting input of the first operational amplifier is configured to input the voltage at the first end of the second capacitor, an output of the first operational amplifier is electrically connected to a gate of the first sensing transistor and outputs the first sensed voltage;

a drain of the first sensing transistor is configured to receive a supply voltage, a source of the first sensing transistor is electrically connected to a first end of the first sensing switch and is configured to output the first sensed current, and a second end of the first sensing switch is electrically connected to the first end of the resistor and the second end of the first capacitor, and a non-inverting input of the second operational amplifier is configured to input the first voltage, an inverting input of the second operational amplifier is configured to input the voltage at the first end of the second capacitor, an output of the second operational amplifier is electrically connected to a gate of the second sensing transistor and outputs the second sensed voltage, a drain of the second sensing transistor is configured to receive the supply voltage, a source of the second sensing transistor is electrically connected to a first end of the second sensing switch and is configured to output the second sensed current, and a second end of the second sensing switch is electrically connected to the first end of the resistor and the second end of the first capacitor.

6. The device according to claim 5, wherein the first sensing switch is configured to turn on when the first sensed current is a positive current and the second sensing switch is configured to turn on when the second sensed current is a negative current.

7. The device according to claim 4, wherein the sensed voltage includes a first sensed voltage and a second sensed voltage, the sensed current includes a first sensed current and a second sensed current, the operational amplifier includes a first operational amplifier, and the third transistor includes a first sensing transistor and a second sensing transistor, wherein:

a non-inverting input of the first operational amplifier is configured to input the first voltage, an inverting input of the first operational amplifier is configured to input the voltage at the first end of the second capacitor, an output of the first operational amplifier is electrically connected to a gate of the first sensing transistor and outputs the first sensed voltage, a drain of the first sensing transistor is configured to receive a supply voltage, a source of the first sensing transistor is electrically connected to the first end of the resistor and the second end of the first capacitor and is configured to output the first sensed current, and the output of the first operational amplifier is electrically connected to a gate of the second sensing transistor and outputs the second sensed voltage, a drain of the second sensing transistor is configured to receive a supply voltage, and a source of the second sensing transistor is electrically connected to the first end of the resistor and the second end of the first capacitor and is configured to output the second sensed current.

8. The device according to claim 4, wherein the second voltage generator is a duplicate of the first voltage generator, the second switch is a duplicate of the first switch, the second capacitor is a duplicate of the first capacitor, the second transistor is a duplicate of the first transistor, and the second light-emitting component is a duplicate of the first light-emitting component.

9. The device according to claim 1, wherein the first switch comprises a first switch with a first end configured to receive the first voltage and a second end electrically connected to the first end of the first capacitor.

10. The device according to claim 9, wherein the first switch is further configured to:

turn the first switch on over the first period to output the first voltage to the first end of the first capacitor; and turn the first switch off over the second period.

11. The device according to claim 1, wherein the first capacitor comprises:

a first capacitor with a first end serving as the first end of the first capacitor and electrically connected to the first switch and the first transistor, and a second end serving as the second end of the first capacitor electrically connected to the voltage regulator.

12. The device according to claim 1, comprising a plurality of first transistors, a plurality of first capacitors, and a plurality of first light-emitting components, the first switch can include a plurality of first switches, and the first voltage generator can generate a plurality of first voltages, wherein the first voltage generator is further configured to output the plurality of first voltages, each first voltage corresponding to a respective transistor; and the voltage regulator is configured to output the second voltage generated to a second end of each first capacitor to compensate for a voltage at a first end of each first capacitor.

13. The device according to claim 1, wherein the first light-emitting component comprises any one or more of a LCD (Liquid Crystal Display), an LED (Light-emitting Diode), a Mini LED (Mini Light-emitting Diode), a Micro LED (Micro Light-emitting Diode, Micro Light-emitting Diode), and an OLED (Organic Light-Emitting Diode).

14. An electronic apparatus, wherein the electronic apparatus comprises a driving device, and the driving device comprises:
a first voltage generator, a voltage regulator, a first switch, a first capacitor, a first transistor, and a first light-emitting component, wherein:
the first voltage generator is configured to generate a first voltage;
the first switch, electrically connected to the first voltage generator and the first capacitor, is configured to output the first voltage to a first end of the first capacitor over a first period;
the voltage regulator, electrically connected to a second end of the first capacitor, is configured to determine a second voltage based on an amount of change in a voltage at the first end of the first capacitor, and to output the second voltage to the second end of the first capacitor over a second period to set the voltage at the first end of the first capacitor; and
the first transistor, electrically connected to the first end of the first capacitor and to the first light-emitting component, is configured to drive the first light-emitting component to emit light using the voltage at the first end of the first capacitor.

15. The electronic apparatus according to claim 14, wherein the first voltage generator comprises:
a first voltage generator configured to generate the first voltage based on luminance information and a predetermined luminance-voltage relationship, the predetermined luminance-voltage relationship including a correlation between the luminance information and a voltage.

16. The electronic apparatus according to claim 14, the voltage regulator comprises:
a current sensor configured to determine a sensed current based on the amount of change in the voltage at the first end of the first capacitor; and
a resistor with a first end electrically connected to the current sensor and the second end of the first capacitor and a second end grounded, wherein the resistor is configured to determine the second voltage based on the sensed current and a resistance of the resistor.

17. The electronic apparatus according to claim 14, wherein the first switch comprises a first switch with a first end configured to receive the first voltage and a second end electrically connected to the first end of the first capacitor.

18. The electronic apparatus according to claim 14, wherein the first capacitor comprises:
a first capacitor with a first end serving as the first end of the first capacitor and electrically connected to the first switch and the first transistor, and a second end serving as the second end of the first capacitor electrically connected to the voltage regulator.

19. The electronic apparatus according to claim 14, wherein the driving device comprises a plurality of first transistors, a plurality of first capacitors, and a plurality of first light-emitting components, the first switch can include a plurality of first switches, and the first voltage generator can generate a plurality of first voltages, wherein
the first voltage generator is further configured to output the plurality of first voltages, each first voltage corresponding to a respective transistor; and
the voltage regulator is configured to output the second voltage generated to a second end of each first capacitor to compensate for a voltage at a first end of each first capacitor.

20. The electronic apparatus according to claim 14, wherein the electronic apparatus comprises a display, a smartphone, or a portable device.

* * * * *